United States Patent [19]

Sandhu et al.

[11] Patent Number: 5,496,762
[45] Date of Patent: Mar. 5, 1996

[54] HIGHLY RESISTIVE STRUCTURES FOR INTEGRATED CIRCUITS AND METHOD OF MANUFACTURING THE SAME

[75] Inventors: Gurtej S. Sandhu; Trung T. Doan; David A. Cathey, all of Boise, Id.

[73] Assignee: Micron Semiconductor, Inc., Boise, Id.

[21] Appl. No.: 253,049

[22] Filed: Jun. 2, 1994

[51] Int. Cl.$^6$ ................................................. H01L 21/70
[52] U.S. Cl. .................. 437/60; 437/918; 148/DIG. 136; 148/DIG. 117
[58] Field of Search .......... 437/60, 918; 148/DIG. 136, 148/DIG. 117

[56] References Cited

U.S. PATENT DOCUMENTS

| | | | |
|---|---|---|---|
| 4,209,716 | 6/1980 | Raymond, Jr. | 357/59 |
| 5,139,825 | 8/1992 | Gordon et al. | 427/255 |
| 5,192,589 | 3/1993 | Sandhu | 427/255 |
| 5,246,881 | 9/1993 | Sandhu et al. | 437/192 |
| 5,254,493 | 10/1993 | Kumar | 437/60 |

FOREIGN PATENT DOCUMENTS 69-22343  3/1969  Japan .

*Primary Examiner*—George Fourson
*Assistant Examiner*—C. Everhart
*Attorney, Agent, or Firm*—Holland & Hart; Angus C. Fox, III

[57] ABSTRACT

This invention is a process for making resistor structures having high stability and reliability characteristics. Process parameters are easily modifiable to adjust the resistivity of the structures. A layer of titanium nitride, which may contain certain impurities such as carbon, is deposited via chemical vapor deposition by pyrolization of an organometallic precursor compound of the formula $Ti(NR_2)_4$ either alone or in the presence of either a nitrogen source (e.g. ammonia or nitrogen gas) or an activated species (which may include a halogen, $NH_3$, or hydrogen radicals, or combinations thereof). The TiN film is then oxidized to create a structure that demonstrates highly stable, highly reliable resistive characteristics, with bulk resistivity values in giga ohm range. In a preferred embodiment of the invention, a predominantly amorphous titanium carbonitride film is deposited on an insulative substrate in a chemical vapor deposition chamber. A layer of titanium is then deposited on top of the titanium carbonitride film. The titanium layer is then patterned with photoresist. The exposed titanium is then etched with a reagent that is selective for titanium over titanium carbonitride (HF, for example, has better than 10:1 selectivity) so that the etch essentially stops when the titanium carbonitride film is exposed. The exposed titanium carbonitride film is then oxidized to achieve the desired resistivity.

16 Claims, 2 Drawing Sheets

HIGHLY RESISTIVE STRUCTURES FOR INTEGRATED CIRCUITS AND METHOD OF MANUFACTURING THE SAME

FIELD OF THE INVENTION

This invention relates to integrated circuits and, more particularly, to the structure and fabrication of resistive structures in such circuits. The resistive structures disclosed herein are useful for a wide variety of applications, including static random access memories (SRAMs) and field emission displays (FEDs).

BACKGROUND OF THE INVENTION

In most integrated circuit applications, there is a need for structures which function as resistors. For years, lightly-doped polysilicon strips have been used as resistors in a wide variety of applications. U.S. Pat. No. 4,209,716, issued to Joseph H. Raymond of Texas Instruments is an example of the use of lightly-doped polysilicon resistor technology in an SRAM application. Most SRAM manufacturers have abandoned this particular use of polysilicon resistors for several reasons. Not only is the resistivity of polysilicon non-linear with respect to voltage, but it is difficult to achieve resistive value consistency in such structures due to a three variables: deposition-related polysilicon film thickness, etch-dependant film width, and doping levels. The three variables interact to establish the resistive value of the structure. Because the variability is too great for megabit SRAMs, most manufactures utilize back-to-back diodes constructed on a polysilicon strip to create resistive structures.

There is a growing need for highly-reliable and highly-stable resistors having resistivities in the giga-ohm range. SRAMs are but one potential application. Field emission displays are another. In field emission displays having cold cathode emitters, stable and reliable resistors having uniform resistivity throughout the display are required to prevent runaway current from the cathode to either the anode plate and/or grid electrodes. Runaway cathode current severely degrades the lifetime of the emitter tips and also raises power consumption to levels which, for most intended applications, are unacceptable.

SUMMARY OF THE INVENTION

This invention is a process for making resistor structures having high stability and reliability characteristics. Process parameters are easily modifiable to adjust the resistivity of the structures.

A layer of titanium nitride, which may contain certain impurities such as carbon, is deposited via chemical vapor deposition by pyrolization of an organometallic precursor compound, $Ti(NR_2)_4$ (tetrakis-dialkylamido-titanium) either alone or in the presence of either a nitrogen source (e.g. ammonia or nitrogen gas) or an activated species (which may include a halogen, $NH_3$, or hydrogen radicals, or combinations thereof). Unlike conventional TiN films (e.g., those deposited using titanium tetrachloride, nitrogen and hydrogen as reactants) which have a crystalline structure and which oxidize most readily at the crystal grain boundaries, TiN films deposited by pyrolizing $Ti(NR_2)_4$ are predominantly amorphous and oxidize uniformly throughout the layer. Predominantly amorphous TiN films which have been subjected to thorough, uniform oxidation demonstrate highly stable, highly reliable resistive characteristics, with bulk resistivity values in the giga ohm range.

In a preferred embodiment of the invention, the predominantly amorphous TiN film is deposited on an insulative substrate in a chemical vapor deposition chamber. A layer of titanium is then deposited on top of the TiN film. The titanium layer is then patterned with photoresist. The exposed titanium is then etched with a reagent that is selective for titanium over TiN (HF, for example, has better than 10:1 selectivity) so that the etch essentially stops when the TiN film is exposed. The exposed TiN film is then oxidized to achieve the desired resistivity.

PREFERRED EMBODIMENT OF THE INVENTION

This invention is a process for making resistor structures having high stability and reliability characteristics. Process parameters are easily modifiable to adjust the resistivity of the structures.

Figure 1:
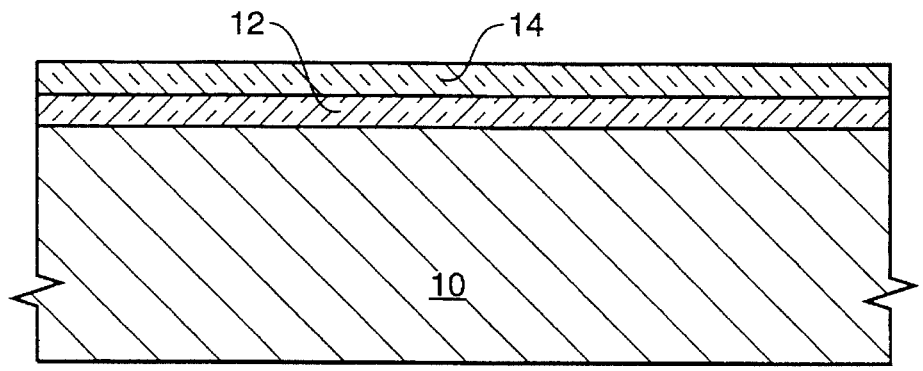
FIG. 1 is a cross-sectional view of a portion of an in-process semiconductor device, showing a semiconductor substrate on which has been formed an insulative layer, and a predominantly amorphous TiN film which has been deposited on top of the insulative layer.

Referring now to FIG. 1, the process begins with the formation of an insulative layer 12 on a semiconductor substrate 10. If silicon is used for the substrate 10, the insulative layer 12 is most easily grown on the substrate surface through oxidation. A titanium nitride layer 14, which may contain certain impurities such as carbon, is then deposited on top of the insulative layer 12 via chemical vapor deposition by pyrolization of an organometallic precursor compound of the formula $Ti(NR_2)_4$ either alone or in the presence of either a nitrogen source (e.g. ammonia or nitrogen gas) or an activated species (which may include a halogen, $NH_3$, or hydrogen radicals, or combinations thereof). Unlike conventional titanium carbonitride films (e.g., those deposited using titanium tetrachloride, nitrogen and hydrogen as reactants) which have a crystalline structure and which oxidize most readily at the crystal grain boundaries, TiN films deposited by pyrolizing $Ti(NR_2)_4$ are predominantly amorphous and oxidize uniformly throughout the layer. Predominantly amorphous TiN films that have been uniformly oxidized demonstrate highly stable, highly reliable resistive characteristics, with bulk resistivity values in the giga ohm range.

An example of a process for depositing titanium nitride through the pyrolization of $Ti(NR_2)_4$ wherein R is an alkyl group in the presence of activated species is found in U.S. Pat. No. 5,246,881. The process is carried out in a low-pressure chemical vapor deposition chamber.

An example of a process for depositing titanium nitride through the pyrolization of $Ti(NR_2)_4$ in the presence of a nitrogen source is found in U.S. Pat. No. 5,192,589. The process is carried out in a low-pressure chemical vapor deposition chamber.

An example of a process for depositing titanium nitride having substantial carbon impurities is the subject of U.S. patent application Ser. No. 07/898,059, now abandoned. Although the deposited material will be referred to as titanium carbonitride (represented by the chemical formula $TiC_xN_y$), the stoichiometry of the compound is variable depending on the conditions under which it is deposited. The deposited films demonstrate excellent step coverage, a high degree of conformality, and an acceptable level of resistivity. The deposition process takes place in a low-pressure chamber (i.e, a chamber in which pressure has been reduced to between 0.1 and 100 Torr prior to deposition), and utilizes an organometallic compound, tetrakis-dialkylamido-titanium, as the sole precursor. Any noble gas, as well as nitrogen or hydrogen, or a mixture of two or more of the foregoing may be used as a carrier for the precursor. The wafer is heated to a temperature within a range of 200°–600° C. Precursor molecules which contact the heated wafer are pyrolyzed to form titanium nitride containing variable amounts of carbon impurities, which deposits as a highly conformal film on the wafer. The carbon impurities not only dramatically increase the bulk resistivity of the film, but also facilitate oxidation of the film.

The carbon content of the titanium nitride films, deposited using any of the three aforementioned processes, may be minimized by utilizing tetrakis-dimethylamido-titanium, $Ti(NMe_2)_4$, as the precursor, rather than compounds such as tetrakis-diethylamido-titanium or tetrakis-dibutylamido-titanium, which contain a higher percentage of carbon by weight.

Figure 2:
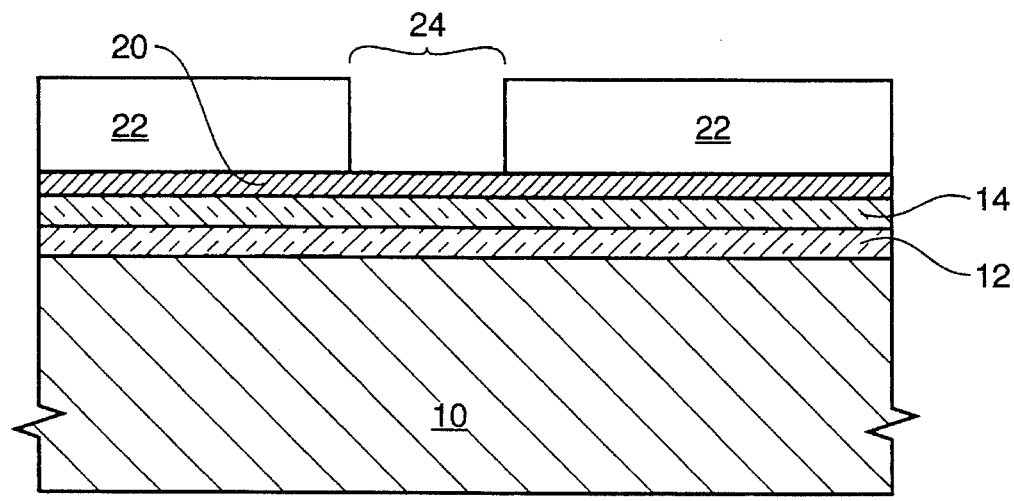
FIG. 2 is a cross-sectional view of the in-process semiconductor device of FIG. 1 following the deposition of a titanium layer on top of the TiN layer, and patterning of the titanium layer with a photoresist mask.

Referring now to FIG. 2, a titanium metal layer 20 is deposited on top of the titanium carbonitride layer 14 by any one of several techniques that are well known in the art. Sputtering is probably the most widely used metal deposition technique. Next, a photoresist mask 22 is created on top of the titanium metal layer 20. The mask exposes the future resistive region.

Figure 3:
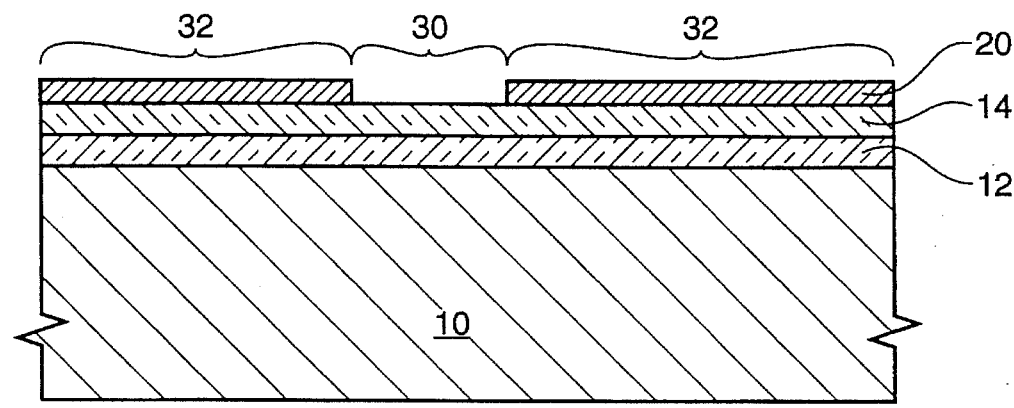
FIG. 3 is a cross-sectional view of the in-process semiconductor device of FIG. 2 following removal of the unmasked portion of the titanium and removal of the photoresist mask.

Referring now to FIG. 3, the portion 30 of the titanium metal layer 20 that is exposed by the mask 22 is etched with a reagent that is selective for titanium metal over titanium carbonitride. Hydrofluoric acid is such a reagent, as it has better than a 10:1 etch selectivity for titanium metal over titanium carbonitride. Because of the etch selectivity, the etch essentially stops when the titanium carbonitride film is exposed. A reactive ion etch that is selective for titanium metal over titanium carbonitride may also be used to remove the titanium metal exposed by the mask 22. The exposed portion of the titanium carbonitride film 30 is then oxidized to achieve the desired resistivity. Several techniques are available for oxidizing the titanium carbonitride. If the photoresist mask 22 is removed by ashing in an oxygen plasma, the exposed portion becomes oxidized as the photoresist mask is being removed. The exposed titanium carbonitride may also be oxidized by subjecting the structure to oxidizing gases in a controlled environment, or by heating the structure to elevated temperatures in the presence of an oxidant such as oxygen gas or ozone.

In this disclosure, it is assumed that the reader understands that the titanium carbonitride layer and the titanium layers are of finite width. In other words, the etched portion of the titanium layer separates the remaining titanium end portions. Were this not so, a direct short would exist. Likewise, unoxidized portions of the titanium carbonitride layer must not surround the oxidized portion and be contiguous therewith. Otherwise, a low-resistance current path would exist through the unoxidized portions that would render the increased resistance of the oxidized portion insignificant.

Figure 4:
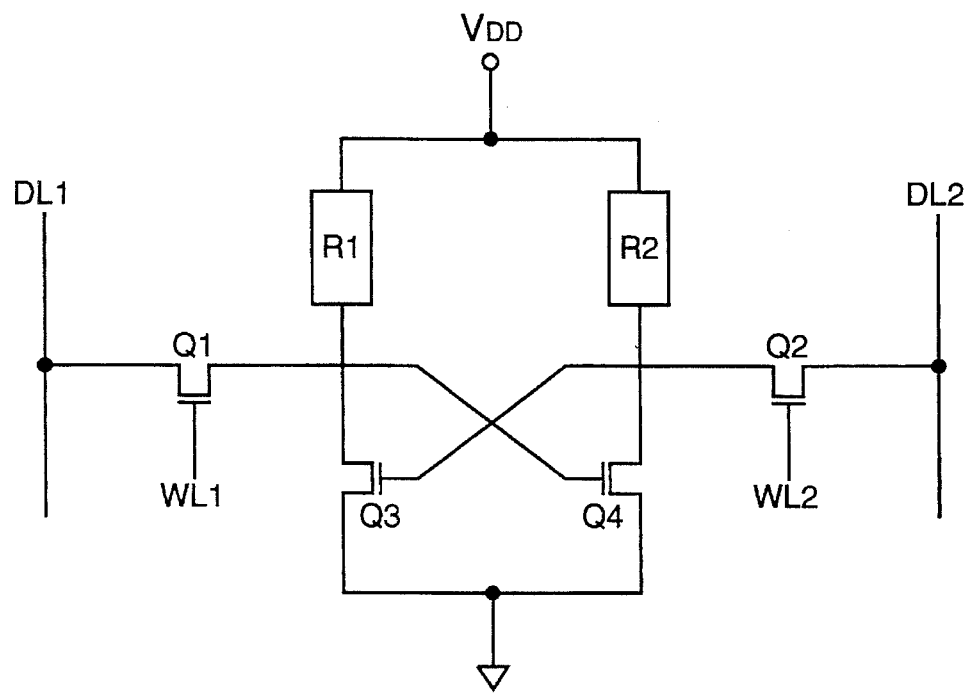
FIG. 4 is a schematic diagram of a MOS static random access memory cell.

Referring now to FIG. 4, an MOS static random access memory cell is depicted. The circuit consists of a cross-coupled inverter connected by pass transistors, Q1 and Q2, to a digit line DL1 and digit bar line DL2, respectively. Each of the pass transistors is activated by a wordline, WL1 and WL2. The purpose of each load device, R1 and R2, is to counteract the effect of charge leakage at the drains of the pull-down transistors, Q3 and Q4, and the pass transistors, Q1 and Q2. Prior art load devices have typically been depletion or enhancement transistors, a p-transistor, or an undoped polysilicon resistor, or back-to-back diodes. Due to the stability and consistency that characterize the resistive structures fabricated using the process of the present invention, such structures are ideal for use as load devices in such applications.

Figure 5:
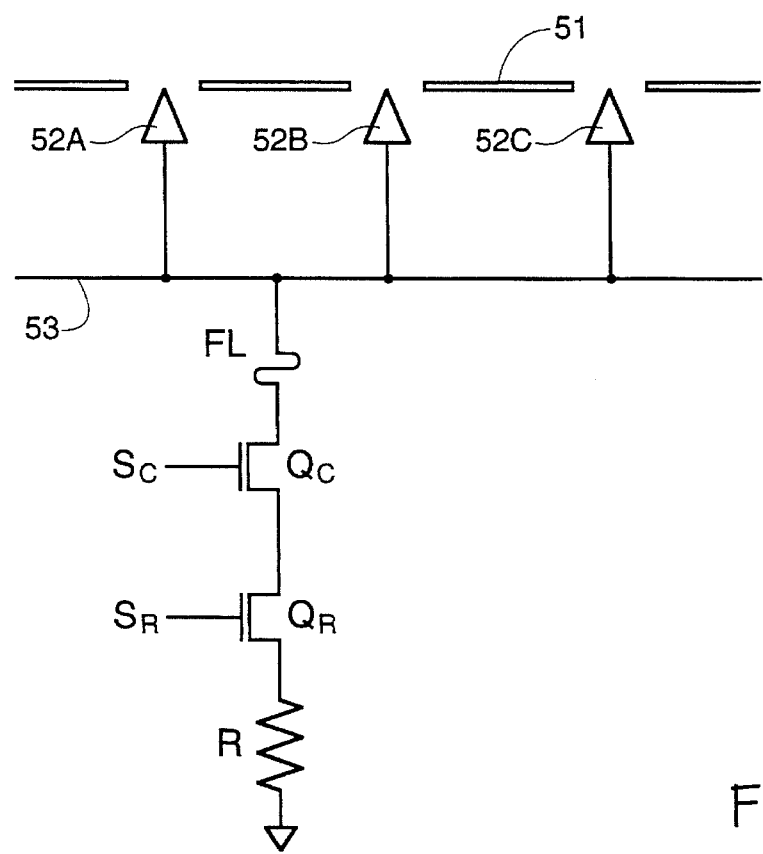
FIG. 5 is a schematic diagram of a field emission display circuit in which low-voltage row and column address signals control a much higher emitter-to-grid voltage.

Referring now to FIG. 5, a single emitter node within a new field-emission display architecture disclosed in U.S. patent application Ser. No. 08/011927, now U.S. Pat. No. 5,357,172 by John K. Lee, et al., is characterized by a conductive grid 51, which is continuous throughout the entire array, and which is maintained at a constant potential, $V_{GRID}$. Each pixel element within the array is illuminated by an emitter group. In order to enhance product reliability and manufacturing yield, each emitter group comprises multiple emitter nodes, and each node contains multiple field emission cathodes (also referred to as "field emitters" or "emitters"). Although the single emitter node depicted by FIG. 5 has only three emitters (52A, 52B, and 52C), the actual number may be much higher. Each of the emitters 52 is connected to a base electrode 53 that is common to only the emitters of a single emitter node. In order to induce field emission, base electrode 53 is grounded through a pair of series-coupled field-effect transistors $Q_c$ and $Q_R$ and a current-regulating resistor R. Resistor R is interposed between the source of transistor $Q_R$ and ground. Transistor $Q_C$ is gated by a column line signal $S_C$, while transistor $Q_R$ is gated by a row line signal $S_R$. Standard logic signal voltages for CMOS, NMOS, TTL and other integrated circuits are generally 5 volts or less, and may be used for both column and row line signals. A pixel is turned off (i.e., placed in a non-emitting state) by turning off either or both of the series-connected FETs ($Q_C$ and $Q_R$). From the moment that at least one of the FETs becomes non-conductive (i.e., the gate voltage $V_{GS}$ drops below the device threshold voltage $V_T$, electrons are discharged from the emitter tips corresponding to that pixel until the voltage differential between the base and the grid is just below emission threshold voltage. Due to the stability and consistency that characterize the resistive structures fabricated using the process of the present invention, such structures are ideal for use in a field emission display application such as this.

Although only several embodiments of the invention have been disclosed herein, it will be obvious to those having ordinary skill in the art of semiconductor manufacturing technology that changes and modifications may be made thereto without departing from the scope and the spirit of the invention as hereinafter claimed.

We claim:

1. A process for manufacturing highly-resistive structures for use in integrated circuits, said process comprising the following sequence of steps:

(a) forming an insulative layer on a semiconductor substrate;

(b) depositing a predominantly amorphous titanium carbonitride layer on top of the insulative layer;

(c) depositing a titanium layer on top of the titanium carbonitride layer;

(d) masking the titanium layer so as to protect certain portions thereof and expose other portions thereof;

(e) removing the exposed portions of the titanium layer so as to expose the underlying titanium carbonitride layer; and (f) oxidizing the exposed portions of the titanium carbonitride layer.

2. The process of claim 1, wherein the predominantly amorphous titanium carbonitride layer is deposited via chemical vapor deposition by pyrolization of an organometallic precursor compound of the formula $Ti(NR_2)_4$ wherein R is an alkyl group.

3. The process of claim 2, wherein pyrolization of the organometallic precursor compound takes place in the presence of a nitrogen source.

4. The process of claim 3, wherein said nitrogen source is ammonia.

5. The process of claim 3, wherein said nitrogen source is nitrogen gas.

6. The process of claim 2, wherein pyrolization of the organometallic precursor compound takes place in the presence of "at least one radical species derived from the group consisting of halogens, ammonia, and hydrogen".

7. The process of claim 1, wherein the exposed portions of the titanium layer are removed with a hydrofluoric acid etch.

8. The process of claim 1, wherein the exposed portions of the titanium layer are removed selectively with respect to the titanium carbonitride layer with a dry etch.

9. The process of claim 1, wherein the exposed portions of the titanium carbonitride layer are oxidized in an oxygen plasma.

10. The process of claim 1, wherein the exposed portions of the titanium carbonitride layer are oxidized by at least one oxidant gas.

11. A process for manufacturing highly-resistive structures for use in integrated circuits, said process comprising the following sequence of steps:

(a) depositing a predominantly amorphous titanium carbonitride layer on top of an insulative layer;

(b) depositing a titanium layer on top of the titanium nitride layer;

(c) masking the titanium layer so as to protect certain portions thereof and expose other portions thereof;

(d) removing the exposed portions of the titanium layer so as to expose the underlying titanium carbonitride layer; and (e) oxidizing the exposed portions of the titanium carbonitride layer.

12. The process of claim 11, wherein the predominantly amorphous titanium carbonitride layer is deposited via chemical vapor deposition by pyrolization of an organometallic precursor compound of the formula $Ti(NR_2)_4$ wherein R is an alkyl group.

13. The process of claim 12, wherein pyrolization of the organometallic precursor compound takes place in the presence of a nitrogen source.

14. The process of claim 13, wherein said nitrogen source is ammonia.

15. The process of claim 13, wherein said nitrogen source is nitrogen gas.

16. The process of claim 12, wherein pyrolization of the organometallic precursor compound takes place in the presence of "at least one radical species derived from the group consisting of halogens, ammonia, and hydrogen".

* * * * *